US007279972B2

(12) United States Patent  
Smithson

(10) Patent No.: US 7,279,972 B2
(45) Date of Patent: Oct. 9, 2007

(54) PREDISTORTION CONTROL APPARATUS

(75) Inventor: Antony James Smithson, North Yorkshire (GB)

(73) Assignee: Andrew Corporation, Westchester, IL (US)

( * ) Notice: Subject to any disclaimer, the term of this patent is extended or adjusted under 35 U.S.C. 154(b) by 175 days.

(21) Appl. No.: 10/514,789

(22) PCT Filed: May 22, 2003

(86) PCT No.: PCT/GB03/02232

§ 371 (c)(1),
(2), (4) Date: Jul. 20, 2005

(87) PCT Pub. No.: WO03/100966

PCT Pub. Date: Dec. 4, 2003

(65) Prior Publication Data

US 2006/0033567 A1    Feb. 16, 2006

(30) Foreign Application Priority Data

May 24, 2002    (GB) .............................. 0212022.8

(51) Int. Cl.
*H03F 1/26* (2006.01)
(52) U.S. Cl. ..................................... 330/149

(58) Field of Classification Search ............. 375/297
See application file for complete search history.

(56) References Cited

U.S. PATENT DOCUMENTS

| | | | |
|---|---|---|---|
| 5,923,712 A | 7/1999 | Leyendecker et al. | 375/297 |
| 6,141,390 A | 10/2000 | Cova | 375/297 |
| 6,285,412 B1 | 9/2001 | Twitchell | 348/608 |
| 7,098,734 B2 * | 8/2006 | Hongo et al. | 330/149 |

FOREIGN PATENT DOCUMENTS

| | | |
|---|---|---|
| EP | 0 116 732 | 8/1984 |
| GB | 2 342 799 | 4/2000 |

* cited by examiner

*Primary Examiner*—Steven J. Mottola
(74) *Attorney, Agent, or Firm*—Steve Mendelsohn

(57) ABSTRACT

A digital predistorter comprises a module J for producing a counteracting signal $V_{m1}$ for combination with the input signal of a power amplifier to correct the output of the amplifier for distorting memory effects within the amplifier. The module J produces the contracting signal $V_{m1}$ by convolving (see FIG. 6) functions of the input signal with impulse response characteristics related to the memory effects being corrected. The counteracting signal $V_{m1}$ is produced by a function $f_m$ and parameters in that function are adjusted to minimize any residual distortion in the amplifier output.

20 Claims, 10 Drawing Sheets

PREDISTORTION CONTROL APPARATUS

FIELD OF THE INVENTION

The present invention relates to apparatus for, and methods of, controlling a predistorter that operates on an input signal to an item of signal handling equipment, such as a power amplifier in a mobile radio telephone, in order to reduce the amount of distortion that the equipment causes in an output signal produced in response to the input signal.

BACKGROUND OF THE INVENTION

It is known to perform predistortion of power amplifier input signals in the digital domain. The digital predistorter is finding increased usage in linearising RF power amplifiers and this is partly due to the recent availability of high sampling rate Analogue to Digital converters (ADCs) and Digital to Analogue converters (DACs) and corresponding improvements in the speed of Digital Signal Processing (DSP) hardware which make this form of linearisation possible. It is also due to the increasing use of non-constant envelope modulation schemes and the ever important need to increase amplifier efficiency which makes this form of linearisation desirable.

However, most conventional predistorters only correct for amplifier distortion that is a function of the instantaneous signal amplitude. This is commonly referred to as AM (Amplitude Modulation) to AM and AM to PM (Phase Modulation) distortion. This form of predistorter, when implemented digitally, often operates with two look-up tables (for adjusting, for example, the gain and phase of the amplifier input signal) which are indexed by the signal amplitude (or some function of the input amplitude) and which then act to modify the amplitude and phase of the signal applied to the amplifier input so as to counter its distortion.

Unfortunately many real amplifiers exhibit distortion that is a function of the signal in the past as well as the present. These amplifiers are said to possess memory. The AM-AM and AM-PM type predistorter described above will have limited performance when linearising an amplifier that exhibits memory since it can only correct for that component of the distortion which can be expressed as a function of the instantaneous signal amplitude.

In general, the amplifier memory effect will become more significant as the signal bandwidth increases and the conventional AM-AM and AM-PM predistorter performance will therefore get correspondingly worse. Since there is often a tendency for signal bandwidth to increase (particularly in the area of mobile telecommunications) the problem of memory effect distortion, and its correction, is now becoming a major problem for RF power amplifier design.

SUMMARY OF THE INVENTION

A predistorter capable of counteracting memory effect distortion can be devised and one aim of the invention is to provide a scheme for controlling such a predistortion technique.

According to one aspect, the invention provides apparatus for controlling a predistorter, said predistorter being arranged to apply a predistortion to an input signal to signal handling equipment to counter memory-effect distortion in an output signal of said equipment, wherein said predistortion is at least partially defined by a set of one or more parameters and the apparatus comprises adjusting means for adjusting said set to determine how adjustments to said set change said distortion and control means for deploying an adjusted version of said set in said predistorter that reduces said distortion.

The invention also consists in a method of controlling a predistorter, said predistorter being arranged to apply a predistortion to an input signal to signal handling equipment to counter memory-effect distortion in an output signal of said equipment, wherein said predistortion is at least partially defined by a set of one or more parameters and the method comprises adjusting said set to determine how adjustments to said set change said distortion and deploying an adjusted version of said set in said predistorter that reduces said distortion.

In a preferred embodiment, the process of adjusting the set involves predicting how adjustments to said set would change said distortion and the version of the set that is then deployed in the predistorter is a version of said set that is predicted to reduce said distortion. Thus, the predistortion control technique can allow one or more parameters specifying the predistortion to be updated without perturbing the operation of the predistorter during the period when updated parameter values are being calculated.

In another embodiment, the adjustment of the set is done in the predistorter itself, so the process of adjusting the set may perturb the operation of the predistorter.

In a preferred embodiment, the prediction process is used to identify a change to the set that minimises the distortion. The minimising adjustment can then be applied to the parameter set being used in the predistorter. It will be appreciated that the accuracy of the mninimisation of the distortion is limited by the capabilities of the particular method used to find the minimum distortion point.

In one embodiment, the effect of an adjustment to the set is predicted by calculating how an adjustment to said set will change a time domain quantity indicative of said distortion in order to predict how said distortion will change. Preferably, said quantity is a normalised average of the magnitude of an error in said output signal.

In one embodiment, the effect of an adjustment to the set is predicted by calculating how an adjustment to said set will change a frequency domain quantity indicative of said distortion in order to predict how said distortion will change. Preferably, said quantity is a measure of the average of the power in said output signal that lies outside a range of desired frequencies. The desired range of frequencies may be the range occupied by the input signal before it gets distorted by the signal handling equipment.

In one embodiment, the predistortion is partly defined by a function of said input signal in which said set appears and the effect of an adjustment to the set is predicted by calculating how an adjustment to said set will change said function and using the change in the function to predict how said distortion will change.

In one embodiment, the predistortion is partly defined by a function of said input signal in which said set appears and said function shapes said predistortion by way of convolving an impulse response characteristic with another function of the input signal to produce a correction signal and subtracting from the correction signal the expectation value of said correction signal at the current state of said input signal in order to produce a difference signal that is used to produce the predistortion.

In preferred embodiments of the invention, the signal handling equipment upon which the linearising technique of the invention operates is a power amplifier or an arrangement of several of such.

BRIEF DESCRIPTION OF THE DRAWINGS

By way of example only, certain embodiments of the invention will now be described with reference to the accompanying figures, in which.

DETAILED DESCRIPTION

Figure 1:
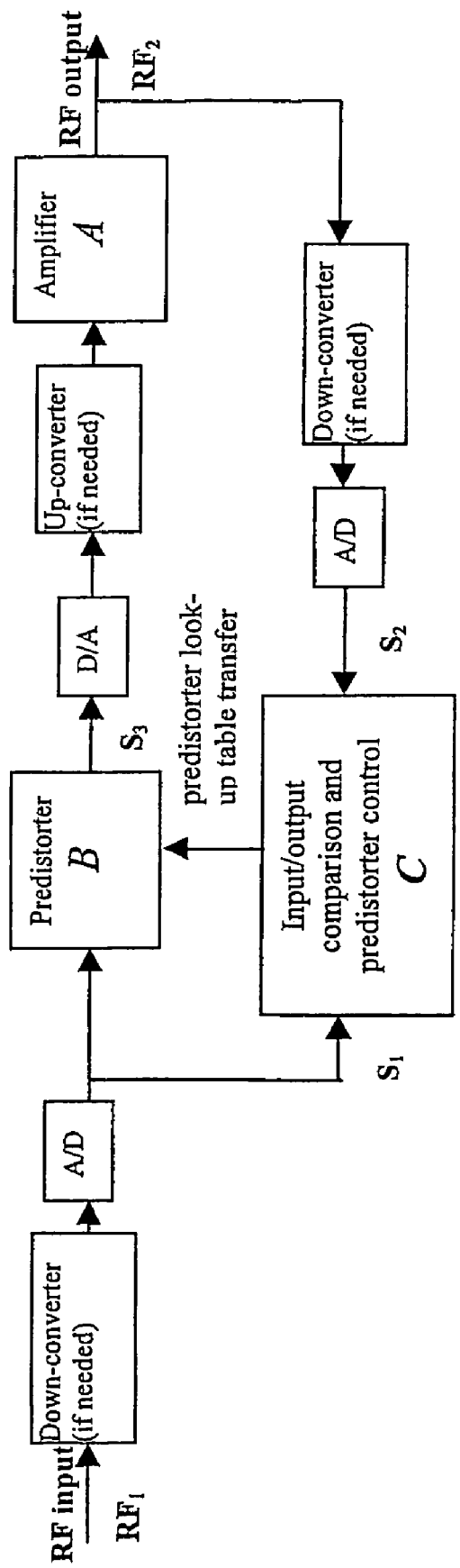
FIG. 1 is a block diagram showing the basic structure of a prior art predistorter.

The basic building blocks of a prior art digital predistorted amplifier are shown in FIG. 1. This form of predistorter often operates with two look-up tables (for adjusting, for example, the gain and phase of the amplifier input signal) which are indexed by the signal amplitude, or some function of the input amplitude, and which then act to modify the amplitude and phase of the signal applied to the amplifier input so as to counter its distortion. However, this form of predistorter will only correct for amplifier distortion which is a function of the instantaneous amplitude of the input signal. Such distortion is commonly referred to as AM (Amplitude Modulation) to AM and AM to PM (Phase Modulation) distortion and is referred to herein as instantaneous distortion.

Unfortunately, many real amplifiers exhibit distortion which is a function of the signal in the past as well as the present and these amplifiers are said to possess "memory". The "instantaneous distortion" type predistorter known from the prior art described above will have limited performance when linearising an amplifier which exhibits this memory effect.

In FIG. 1, the RF input signal $RF_1$ to the amplifier A is, if necessary, down-converted in frequency and then converted into a digital signal $S_1$ at the A/D block. $S_1$ is supplied to a predistorter function B and also to control block C. The predistorter B alters $S_1$ into $S_3$ which subsequently undergoes conversion back to the analogue domain at the D/A block and, if necessary, frequency up-conversion before being supplied to the amplifier A. The linearised output $RF_2$ of amplifier A is then sampled by control block C as signal $S_2$ using appropriate A/D conversion and, if necessary, frequency down-conversion. Block C compares the signals $S_1$ and $S_2$ and uses the result to adapt the operation of predistorter B to optimise linearisation of $RF_2$.

Figure 2:
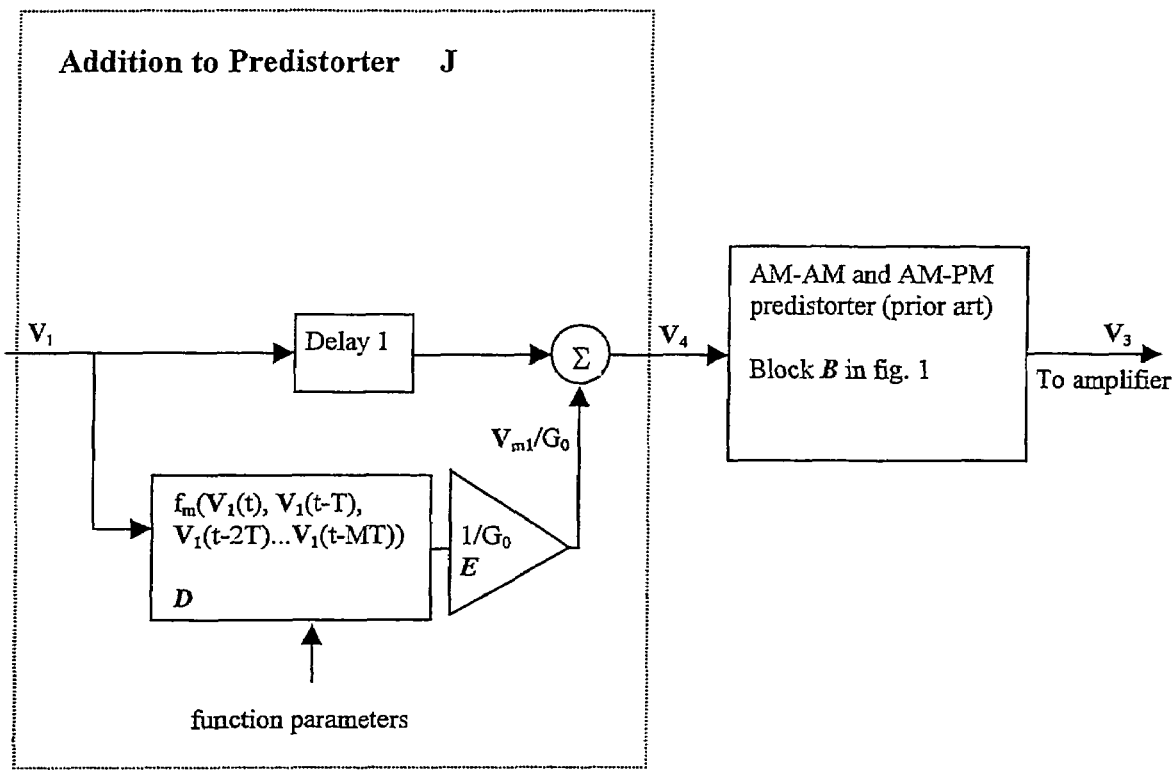
FIG. 2 is a block diagram showing the basic structure of a predistorter capable of performing memory-effect correction.

FIG. 2 illustrates the basic architecture of the modified digital predistorter (B) which incorporates correction for both the instantaneous distortion signal and the memory distortion signal.

It can be seen that the modification to the predistorter which performs memory distortion correction involves a functional block J placed just prior to the AM-AM and AM-PM predistorter. In other words, there are no changes required to the AM-AM and AM-PM predistorter block. This provides the advantage that an existing predistorter product can be retrofitted in a relatively simple manner with a memory effect predistorter according to an embodiment of the present invention.

In block J, delay 1 compensates for delays in blocks D and E and T is the sample period and MT is the maximum time interval over which contribution to $V_m$ (the output signal error component attributable to the memory effect) is non negligible.

Figure 3:
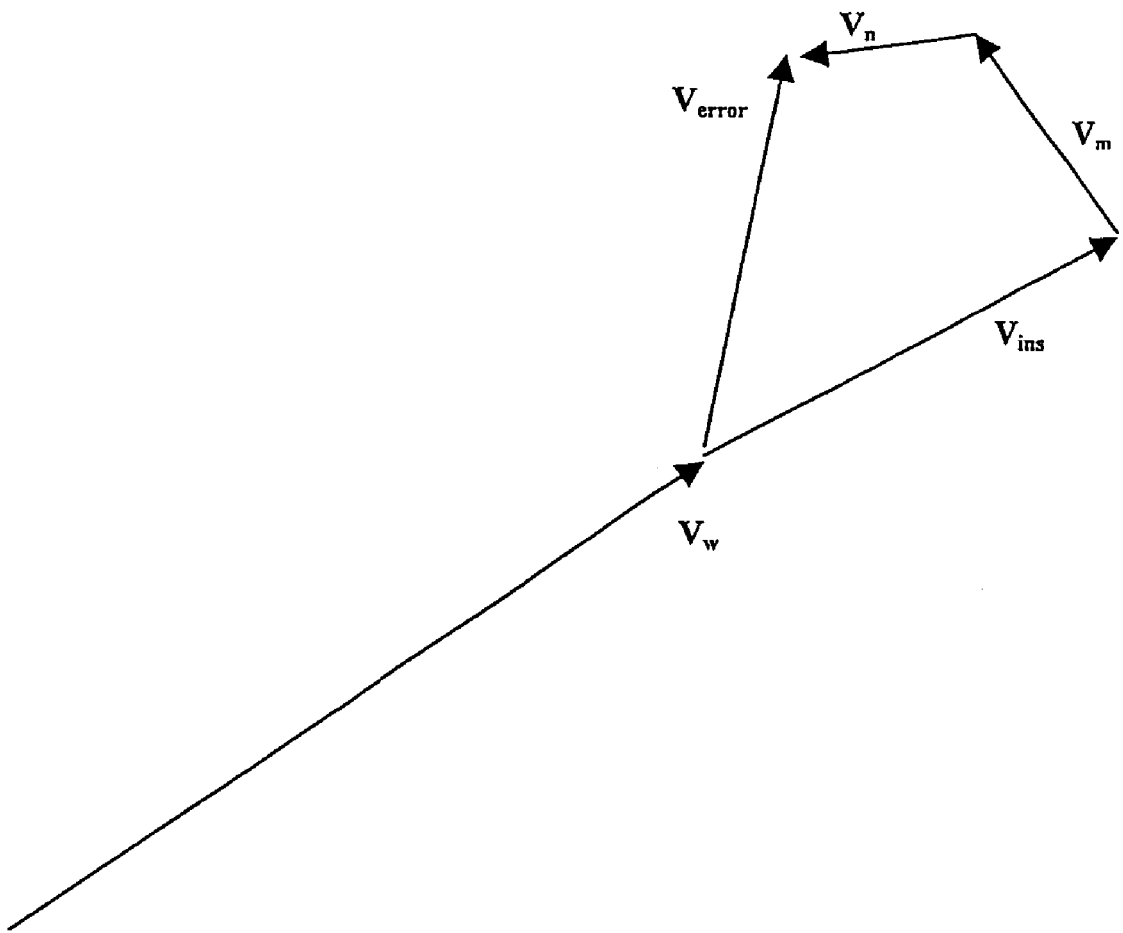
FIG. 3 is a vector diagram showing signals in an amplifier to be linearised.

If the predistorter is turned off (such that it acts as a linear gain stage), then the signal appearing at the output of the amplifier at any instant in time can be represented in phase and amplitude on a vector diagram as illustrated in FIG. 3.

The following vectors are shown in FIG. 3:

$V_w$ is the linearly amplified output vector as would be output by an ideal, non distorting amplifier.

$V_{ins}$ is the distortion vector which is simply a function of the instantaneous input signal amplitude (this represents AM to AM and AM to PM distortion). This will be called the instantaneous distortion vector.

$V_m$ is the distortion vector which is a function of the input signal at times in the past as well as the present. This will be called the memory distortion vector.

$V_n$ is an error vector due to system noise figure, digitising quantisation noise, gain and phase ripple, unwanted spurious signals etc. This error vector cannot be removed by predistortion and represents the residual distortion remaining after conventional predistortion and memory compensation have been applied.

$V_{error}$ is the total error vector taking into account all contributing error vectors.

$|V_1|$ is the input signal amplitude, so we can write:

$$V_{ins} = f_{ins}(|V_1|).$$

Also, $V_m$ can be more precisely expressed as:

$$V_m = f_m(V_1(t), V_1(t-\delta t), V_1(t-2\delta t) \ldots V_1(t-M.\delta t))_{\lim_{\delta t \to 0}} \quad (1)$$

where $M.\delta t$ is the memory duration, i.e. the longest interval over which the contribution to $V_m$ is non-negligible.

$V_m$ has the property that its expectation value when evaluated at any input amplitude is zero. This can be expressed as $$E\{V_m\}_{|V_1|} = 0 \quad (2)$$

The function $E\{V\}_{|V_1|}$ is the expectation value or mean value of V when evaluated at some amplitude $|V_1|$.

The purpose of the predistorter is to distort the signal (or vector) at the amplifier input such that the signal at the amplifier output has an additional vector present which is equal and opposite to the total distortion vector produced by the amplifier. In this way the net distortion vector present at the amplifier output is zero (ideally).

Since the instantaneous distortion vector $V_{ins}$ can be defined as a function of only the instantaneous input amplitude $|V_1|$ i.e. $V_{ins}=f(|V_1|)$ it follows that in order to predistort and remove this vector at the amplifier output we need a predistorter which is also a function of the instantaneous input amplitude. If $V_1$ at any instant of time is expressed as a complex quantity:

$$V_1 = A_1 \exp(j\theta_1) \text{ where } A_1 = |V_1|$$

then the predistorter output $V_3$ can be written $$V_3 = G_p(A_1).A_1 \exp(j\theta_1 + jP_p(A_1)) \quad (3)$$

where $G_p(A_1)$ and $P_p(A_1)$ represent the amplitude dependent gain and phase shift of the predistorter.

If we also represent the amplifier amplitude dependent gain and phase shift as $G_A(A_1)$ and $P_A(A_1)$ then the predistortion is optimum for the instantaneous distortion vector ($V_{ins}=0$) when the amplifier output can be written as $$V_2 = G_A(G_p(A_1).A_1).G_p(A_1).A_1.\exp(j\theta_1 + jP_p(A_1) + jP_A(G_p(A_1).A_1)) \quad (4)$$

where:

$$G_A(G_p(A_1).A_1).G_p(A_1) = G_0 = \text{constant} \quad (5)$$

and:

$$P_p(A_1) + P_A(G_p(A_1).A_1) = \Theta_0 = \text{constant} \text{ (=0 for simplicity)} \quad (6)$$

A common way of implementing the predistorter correction for $V_{ins}$ is through the use of look-up tables for $G_p(A_1)$ and $P_p(A_1)$ and which satisfy equations 5 and 6. Alternatively, if the predistorter is implemented using Cartesian signals we use look-up tables $LI(A_1)$ and $LQ(A_1)$ such that $$V_3 = \{LI(A_1) + j. LQ(A_1)\}.A_1.\exp(j\theta_1) \quad (7)$$

and where $G_p(A_1) = \{LI(A_1)^2 + LQ(A_1)^2 + LQ(A_1)^2\}^{1/2} \quad (8)$ $$P_p(A_1) = \tan^{-1}(LQ(A_1)/LI(A_1)) \quad (9)$$

Removing the memory distortion vector $V_m$ from the amplifier output can be achieved by adding a signal vector $V_{m1}/G_0$ to the predistorter input signal $V_1$. In this way the output of the amplifier when the predistorter look-up tables $G_p$ and $P_p$ (or LI and LQ) satisfy equations 5 and 6 is:

$$V_2 = G_0.V_1 + V_{m1} + V'_m + V_n \quad (10)$$

where $V'_m$ is the memory distortion vector which is now slightly different from $V_m$ owing to the predistortion of $V_1$. However, $V'_m$ will still have the same form as equation 1 and will satisfy equation 2.

If $V_{m1}$ is chosen such that $V_{m1} = -V'_m$ then we are left with $$V_2 = G_0.V_1 + V_n \quad (11)$$

In other words the amplifier non-linearity signals have been removed and we have at the amplifier output a linearly amplified input signal and noise.

The function to be evaluated in block D of FIG. 2 is therefore of the form:

$$f_m(V_1(t), V_1(t-\delta t), V_1(t-2\delta t) \ldots V_1(t-M\delta t))_{lim \ \delta t \to 0}.$$

and must satisfy the condition $E\{f_m(\ )\}_{|V_1|} = 0$.

The function $f_m(\ )$ will, in general, be a mixture of linear and non-linear processes and some specific embodiments for this function are summarised below.

Figure 4:
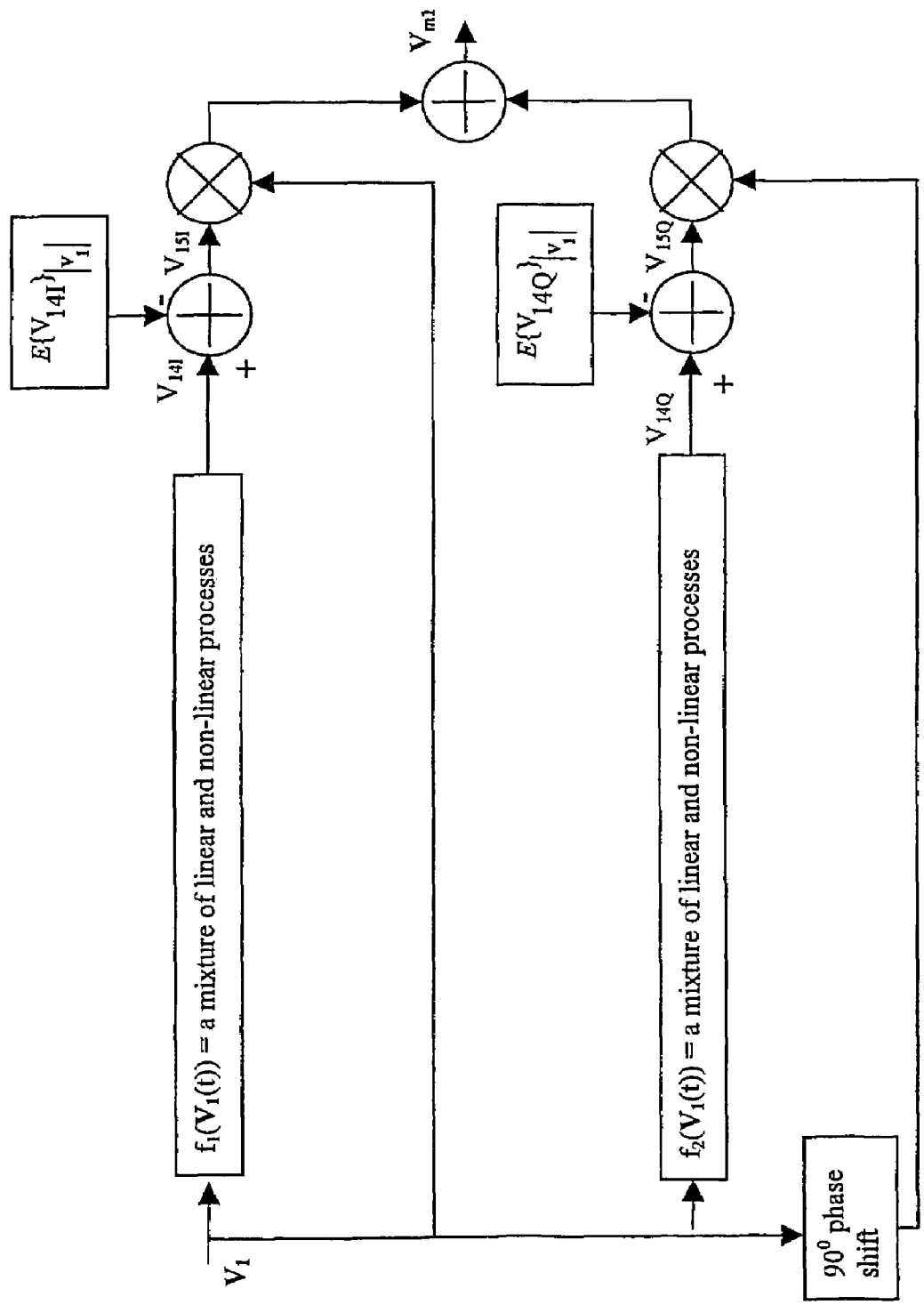
FIG. 4 is a block diagram showing the structure of a Cartesian version of the predistorter of FIG. 2 in more detail.
Figure 5:
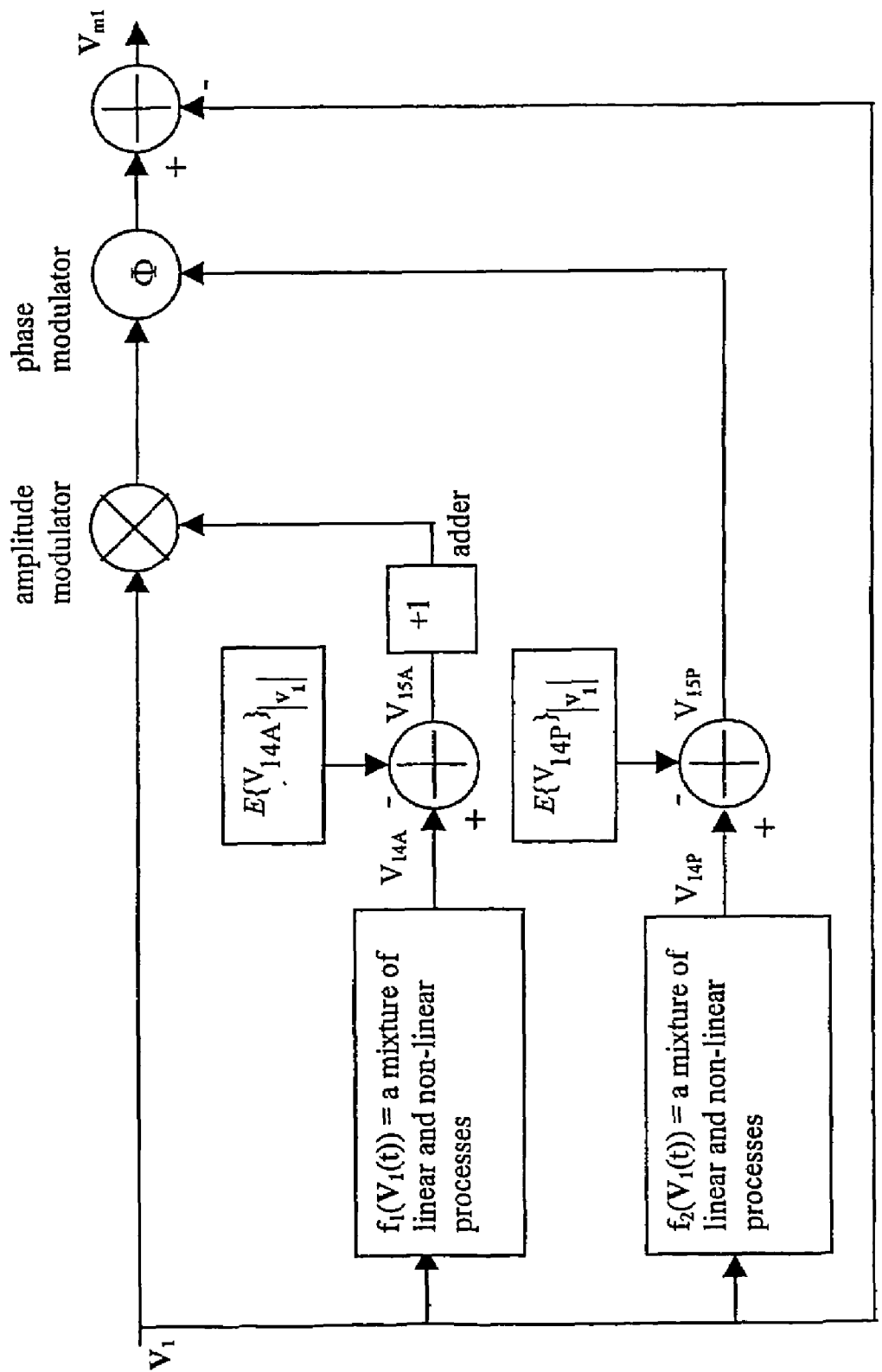
FIG. 5 is a block diagram showing the structure of a polar version of the predistorter of FIG. 2 in more detail.

In general, the function $f_m(\ )$, the function implemented by block D of FIG. 2, will be a mixture of linear and non-linear processes and its detailed implementation will vary according to the characteristics of the specific amplification device being used. In FIGS. 4 and 5, $f_m(\ )$ is shown in a form that will facilitate implementation in an FPGA (Field Programmable Gate Array) or ASIC (Application Specific Integrated Circuit).

A generic Cartesian implementation of $f_m(\ )$ is presented in FIG. 4 which is sufficiently general to cover the majority of amplification devices. The function $E\{V\}_{|V_1|}$ is the expectation value or mean value of V when evaluated at the input amplitude $|V_1|$. Depending on the form of $f_m(\ )$ it may be possible to express $E\{V_{14I}\}_{|V_1|}$ and $E\{V_{14Q}\}_{|V_1|}$ as relatively simple functions of $V_1$ for ease of calculation. $E\{V_{14I}\}_{|V_1|}$ is subtracted from $f_1$ to produce a first difference signal and $E\{V_{14Q}\}_{|V_1|}$ is subtracted from $f_2$ to produce a second difference signal. The subtraction of the quantities $E\{V_{14I}\}_{|V_1|}$ and $E\{V_{14Q}\}_{|V_1|}$ ensures that $E\{V_m\}_{|V_1|} = 0$ or $E\{f_m(\ )\}_{|V_1|} = 0$ as required. The difference signal produced in the $f_1$ path is multiplied with the version of $V_1$ passing through block D. The difference signal produced in the $f_2$ path is multiplied with a version of $V_1$ that has been offset by 90 degrees. The outputs of the two multiplication processes are then summed to produce $V_{m1}$.

A generic polar implementation of $f_m(\ )$ is presented in FIG. 5 which is sufficiently general to cover the majority of amplification devices. The subtraction of $E\{V_{14A}\}_{|V_1|}$ and $E\{V_{14P}\}_{|V_1|}$ ensures that $E\{V_m\}_{|V_1|} = 0$ or $E\{f_m(\ )\}_{|V_1|} = 0$ as required. The difference signal produced in the $f_2$ path is used to modulate the phase of the version of $V_1$ passing through block D. The difference signal produced in the $f_1$ path is offset by +1 and then used to modulate the amplitude of the version of $V_1$ passing through block D.

Clearly, if functional block J (FIG. 2) is modified by removing the direct path for $V_1$ then in this embodiment of $f_m(\ )$ the subtraction of $V_1$ just prior to output of $V_{m1}$ is unnecessary.

The nature of the functions $f_1$ and $f_2$ employed in FIGS. 4 and 5 will now be discussed in more detail with reference to FIGS. 6, 7 and 8.

Figure 6:
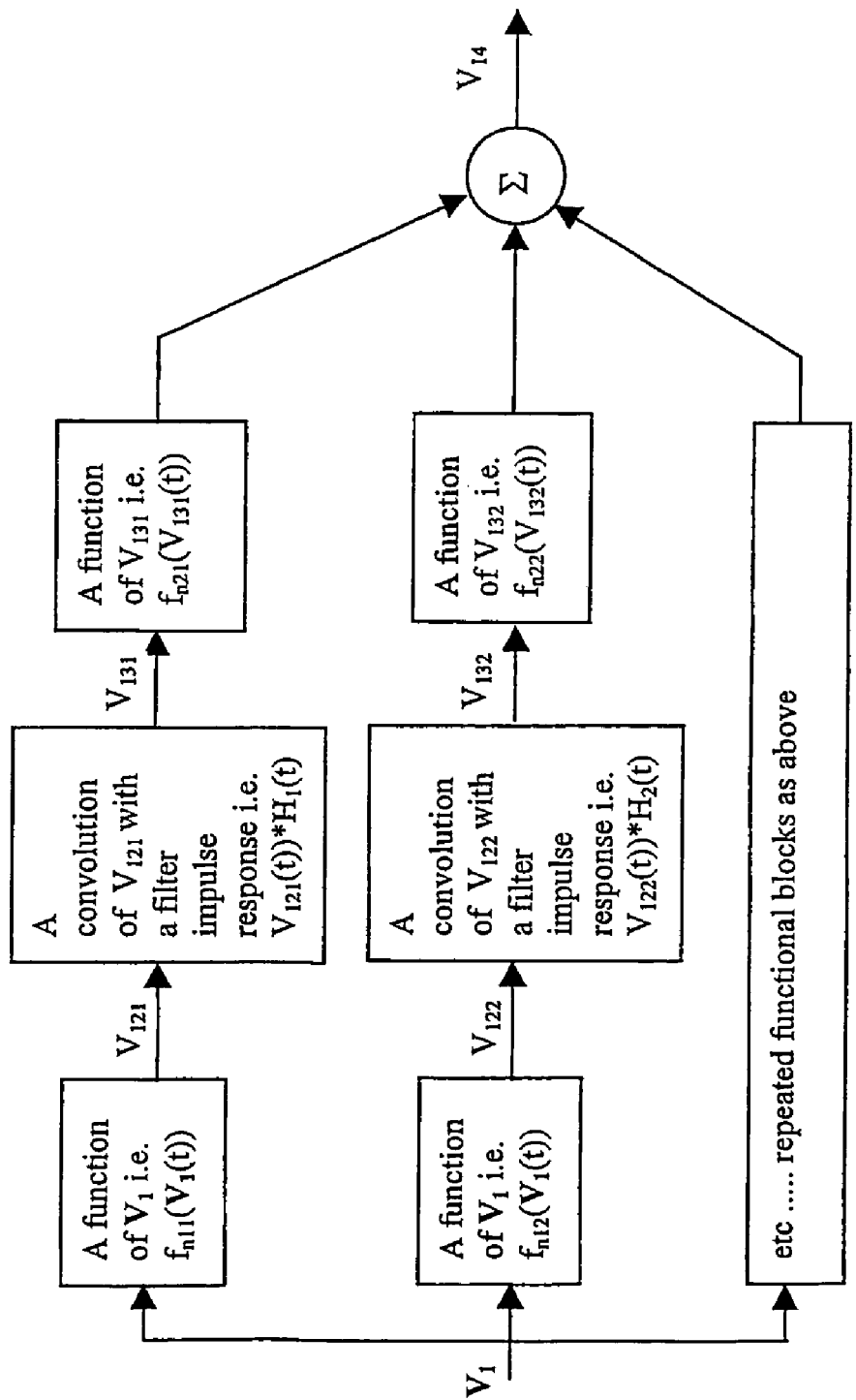
FIG. 6 is a block diagram showing the generic form of the functions $f_1$ and $f_2$ used in FIGS. 4 and 5.
Figure 7:
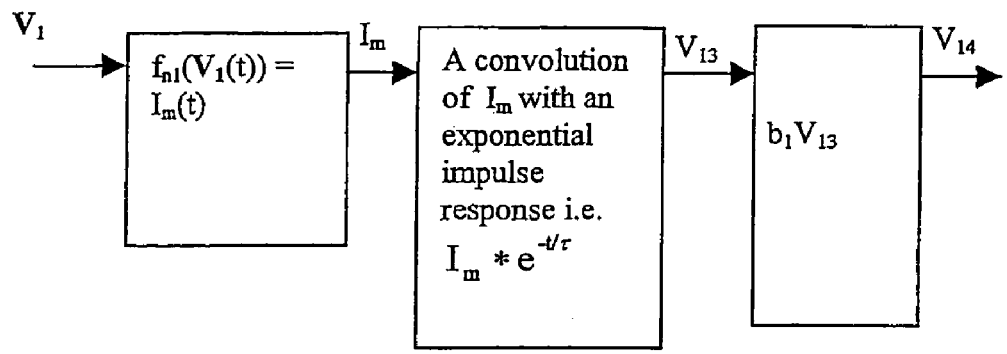
FIG. 7 shows a variant of the structure of the functions $f_1$ and $f_2$ given in FIG. 6.

FIG. 6 shows the general form used for both of the functions $f_1$ and $f_2$. $V_1$ is supplied to each of a number of paths where signal processing is performed. The outputs of the paths are then summed to produce signal $V_{14}$. There can be as many paths as required. Each path operates on $V_1$ to produce initially a signal, e.g. $V_{121}$, which is a function of $V_1$, which is then convolved with a filter impulse response, e.g. $H_1(t)$, to produce a further signal, e.g. $V_{131}$, which is in turn processed such that a function, e.g. $f_{n21}$, of that signal issues from the path to the summation point. It will be apparent that $f_1$ need not be the same as $f_2$, for example $f_{n11}$ for $f_1$ and $f_2$ need not be the same.

The preferred generic embodiment of functions $f_1$ and $f_2$ can be significantly simplified if we make a number of assumptions relating to the physical cause of the amplifier memory effect. If we assume that the memory effect is due to modulation of the amplitude or phase of the signal and the modulation is linearly proportional to the value of a single physical variable (such as device temperature or bias voltage) and if we assume the physical variable is a function of the mean current ($I_m$) through the amplifying device and the function has an impulse response of the form $e^{-t/\tau}$, then the form of $f_1$ and $f_2$ can be simplified to that shown in FIG. 7.

In many cases it is a good approximation to make $I^m(t) \approx |V_1(t)|^2$ and it should be noted that in general the time constant $\tau$ and coefficient $b_1$ will be different for functions $f_1$ and $f_2$.

Figure 8:
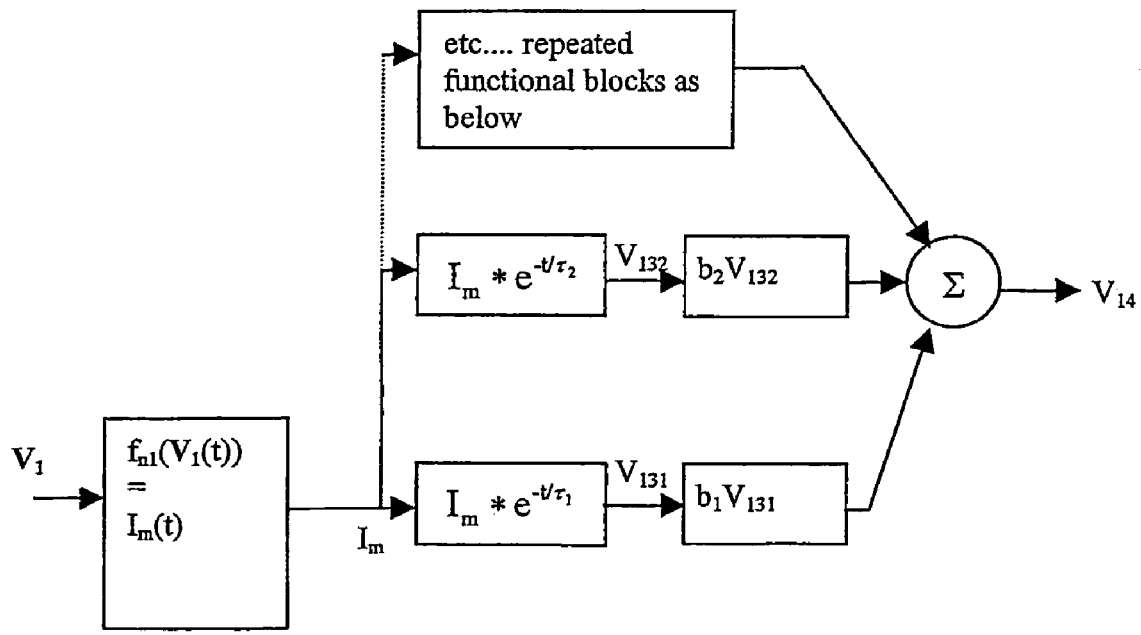
FIG. 8 shows another variant of the structure of the functions $f_1$ and $f_2$ given in FIG. 7.

If we assume that the amplifier memory effect is due to modulation of the amplitude or phase of the signal and the modulation is linearly proportional to the value of several physical variables (such as device temperature, bias voltage etc.) and if we assume the physical variables are separate functions of the mean current ($I_m$) through the amplifying device and the functions have an impulse response of the form $e^{-t/\tau}$ then the form of $f_m(\ )$ can be simplified to that shown in FIG. 8. It is assumed that the mean current is averaged over a time interval significantly longer than the carrier period and significantly shorter than the period of the maximum modulation signal frequency. Depending on the amplification device it may again be valid to approximate $I_m(t)$ as $|V_1(t)|^2$.

In particular the situation postulated in the preceding paragraph can occur when the memory vector is made up from a number of memory effects at differing time-constants. This is likely to be the situation for most power amplifiers, as memory effects will result from thermal issues in the power device(s) and bias interaction with the range of de-coupling capacitors typically used on the gate and drain of, for example, an FET device. Each of these (the thermal and multiple capacitor-based time-constants) will result in a memory vector which has a different time constant.

It is worth noting that, to the skilled person, it will be apparent that the predistorter functions used for instantaneous distortion vector correction and memory distortion vector correction could be pre-programmed and then subsequently left unchanged. Such an 'open loop' predistorter will work satisfactorily when the amplifier distortion characteristics do not change with time, temperature etc or when only small linearity improvements are required. However, adaptive control of the predistorter for both instantaneous and memory distortion vectors is desirable when changes to the amplifier distortion characteristics are expected. A number of control schemes for the look up tables $G_p$ and $P_p$ (see equation 3 above)—or LI and LQ if control is implemented in the Cartesian format—have been documented and will not be discussed again here.

Figure 9:
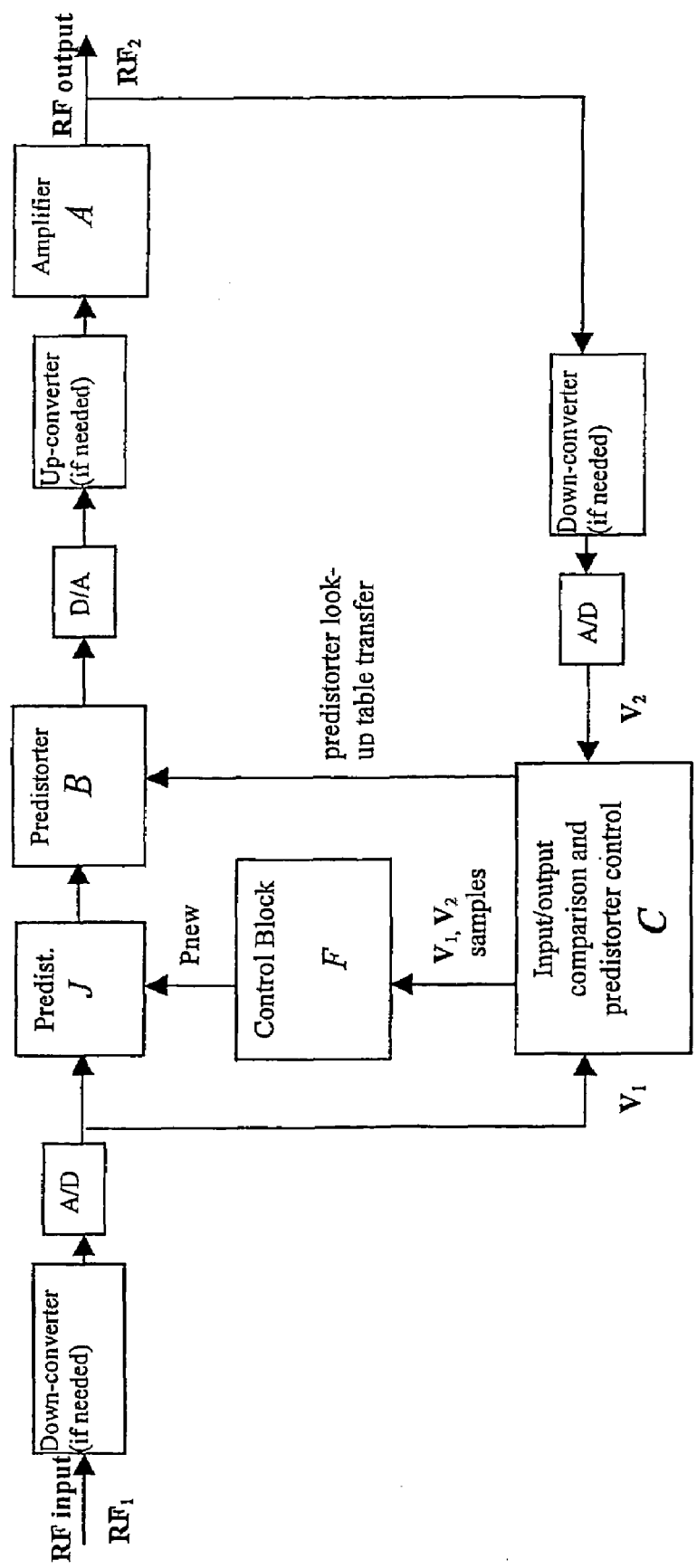
FIG. 9 shows an overview of a system for addressing both memory effect and instantaneous distortion and in particular shows elements for controlling memory effect predistortion.

We will now describe some control schemes that are suitable for controlling the memory effect predistortion blocks in the systems described above. FIG. 9 shows an overview of the system of FIG. 2 and includes the elements responsible for controlling the memory effect predistorter. In FIG. 9, a control block F receives successive pairs of samples of the input and output signals $V_1$ and $V_2$. Block F uses series of pairs of these values to update a set of parameters P that control the memory effect predistorter J. The process of determining the updated set of parameters $P_{new}$ involves manipulating P and testing to see if the changes to P would improve the operation of the memory effect predistorter J. Block F calculates the revised parameters $P_{new}$ in a separate process operating alongside the predistorter J and the revised parameters $P_{new}$ are then loaded into the memory effect predistorter. Thus, the process of determining the new parameters $P_{new}$ does not require changing the actual parameters P that are being used within the memory effect predistorter J which would degrade the performance of predistorter J whilst the revised parameters $P_{new}$ were being calculated.

Since, by definition $E\{V_{m1}\}_{|V_1|}=0$, any changes to the control parameters of the memory effect predistorter J will not affect the instantaneous predistorter B. Thus the memory effect predistorter J can be controlled independently of the instantaneous predistorter B, without control adjustments to one of the predistorters degrading the signal correction being performed by the other one of the predistorters.

The control scheme for the memory effect predistorter J operates by using a fixed form for $f_m(\ )$, the function implemented by block D in FIG. 2, but with variable function parameters. For example, a function with a fixed form and variable parameter is $f(x)=ax^b+cx^d$ where b and d are fixed serving to set the form of the function but a and c are variable parameters. The optimum set of function parameters for $f_m(\ )$ is then found by block F by minimising a quantity which relates to the magnitude of the memory vector ($V_m$) at the amplifier output.

The quantity to be minimised may be calculated in either the frequency or the time domain and there are advantages and disadvantages with each approach. If the magnitude of $V_m$ is significant compared to the total error vector ($V_{error}$) then the average magnitude of $V_{error}$ can be used as the quantity to be minimised. This is readily obtained by comparing $V_1$ and $V_2$ in the time domain. Alternatively, if the magnitude of $V_m$ is significant compared to the total error vector there will be a significant contribution to the 'out-of-band' signal power (i.e. outside the wanted signal bandwidth) as seen in the frequency domain. A quantity relating to the signal power in a range of frequencies outside the wanted signal bandwidth can therefore also be used as the quantity to be minimised.

Preferred embodiments for the algorithms used by block F to determine the optimum set of parameters to be used in the predistorter memory function $f_m(\ )$ will now be discussed.

Figure 10:
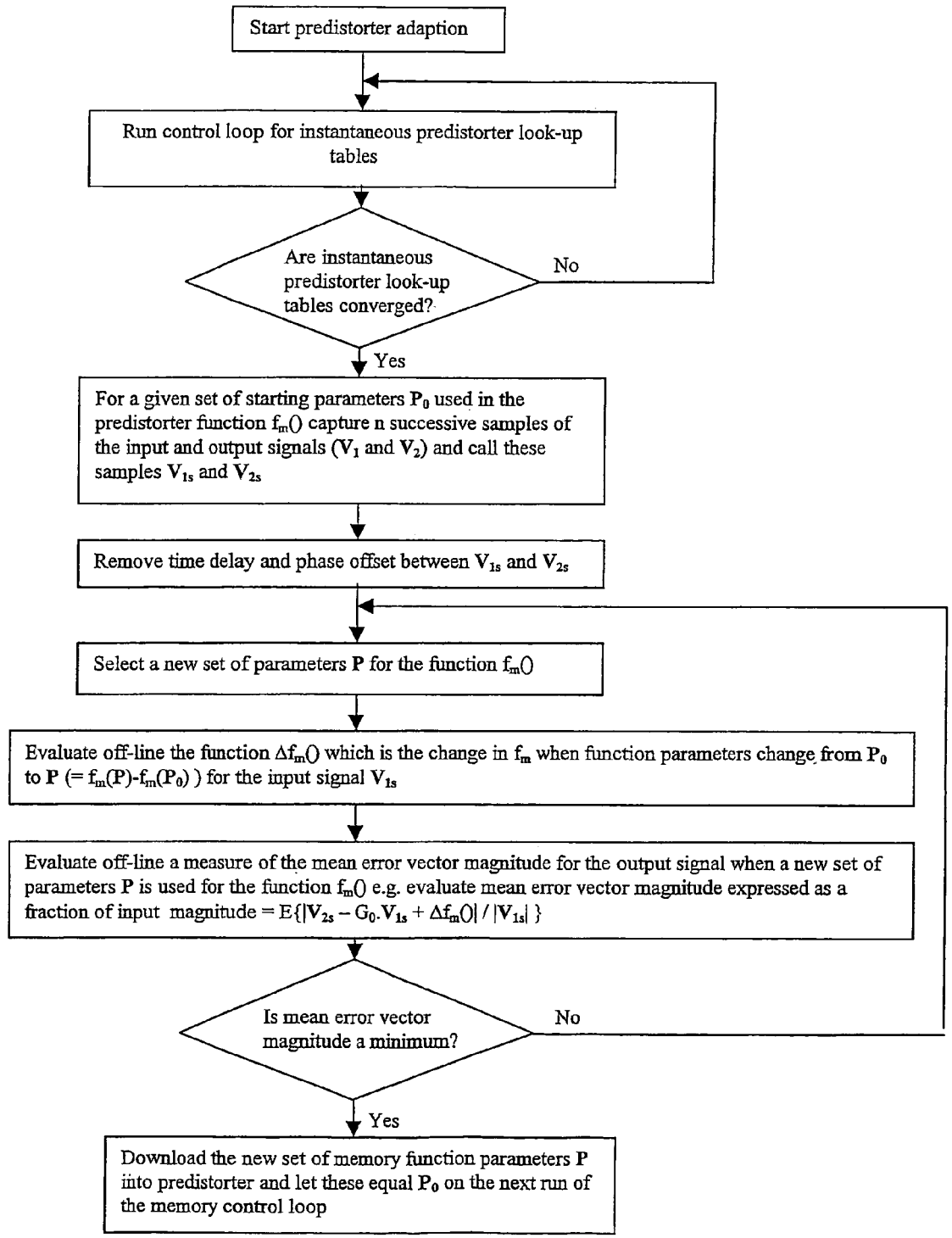
FIG. 10 is a flow diagram of a control algorithm for the memory effect predistorter of FIG. 2 based on the minimisation of a quantity in the time domain.

FIG. 10 shows a control algorithm for updating the parameters P of the memory effect predistorter J based on the minimisation of a quantity in the time domain. This algorithm is performed by control block F upon receipt from block C of a series of successive samples of the input and output signals $V_1$ and $V_2$ of the amplifier and results in updated parameters $P_{new}$ for use in the function $f_m(\ )$ and calculated to cause the minimisation of $V_m$.

With reference to FIG. 10, the algorithm commences with a loop which waits for the operation of the instantaneous predistorter B to settle to a steady state. Once this has occurred, the algorithm continues by capturing n successive pairs of samples of the input and output signals ($V_1$ and $V_2$). Then, the time delay and the phase offset between the captured samples of $V_1$ and $V_2$ are removed.

Next, the algorithm enters a minimisation loop that aims to minimise $$E\left\{\frac{|V_{error}|}{|V_1|}\right\},$$

the mean of the error vector magnitude normalised by the input signal magnitude with averaging done over the sample pairs of $V_1$ and $V_2$. In FIG. 10, this loop is shown only figuratively. For example, the flow chart does not show the details of how one tests for a minimum in $$E\left\{\frac{|V_{error}|}{|V_1|}\right\},$$

partly for the sake of clarity and partly because such a test can be performed in any of a number of ways.

The first step in the minimisation loop is the selection a new set of parameters $P_{nom}$ for the function $f_m(\ )$ to replace the set of parameters $P_0$ currently being used in the predistorter. The details of how one selects the new values of the parameters depends on the details of the process employed for testing for a minimum in $$E\left\{\frac{|V_{error}|}{|V_1|}\right\}.$$

Having nominated a new set of parameters $P_{nom}$, the algorithm then proceeds to evaluate the function $\Delta f_m$ which is the change in $f_m$ when the parameters of the function change from $P_0$ to $P_{nom}$, i.e. $\Delta f_m = f_m(P_{nom}) - f_m(P_0)$. The next step within the minimisation loop is the evaluation of the quantity $$E\left\{\frac{|V_{error}|}{|V_1|}\right\}$$

at the set of parameters $P_{nom}$, i.e. the algorithm now calculates $$E\left\{\frac{|V_2 - G_0.V_1 + \Delta f_m()|}{|V_1|}\right\}.$$

The next step within the minimisation loop is to check if $$E\left\{\frac{|V_2 - G_0.V_1 + \Delta f_m()|}{|V_1|}\right\}$$

is a minimum. If not, the algorithm returns to the step of selecting a new set of parameters $P_{nom}$, selects a new set and proceeds with evaluating $$E\left\{\frac{|V_2 - G_0.V_1 + \Delta f_m()|}{|V_1|}\right\}$$

for the new set.

Thus, the minimisation loop basically checks to see if $$E\left\{\frac{|V_2 - G_0.V_1 + \Delta f_m()|}{|V_1|}\right\}$$

is a minimum as $\Delta f_m()$ is varied by varying $P_{nom}$. When the algorithm exits the minimisation loop, the set of parameters $P_{nom}$ that minimised $$E\left\{\frac{|V_{error}|}{|V_1|}\right\}$$

becomes $P_{new}$ and is loaded into block D for generating $V_{m1}$. $P_{new}$ then becomes $P_0$ in preparation for the next time that the system carries out the algorithm of FIG. 10.

Figure 11:
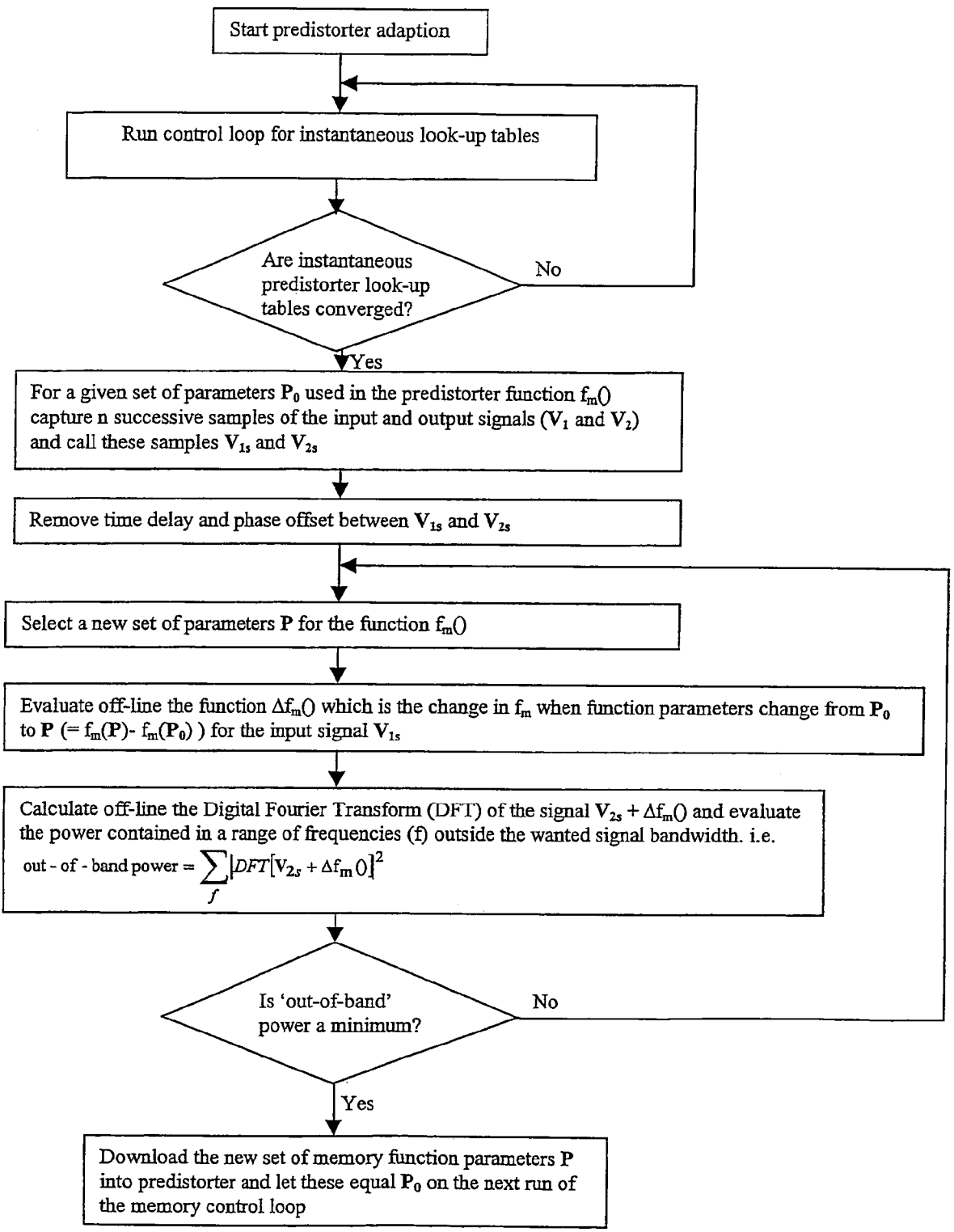
FIG. 11 is a flow diagram of a control algorithm for the memory effect predistorter of FIG. 2 based on the minimisation of a quantity in the frequency domain.

FIG. 11 shows a control algorithm for the memory effect predistorter J based on the minimisation of a quantity in the frequency domain. This control scheme operates in a similar manner to that described with reference to FIG. 10 but the quantity that is minimised is instead a measure of the power in $V_2$ that lies outside the desired bandwidth of $V_2$. To obtain this quantity, the digital Fourier transform (DFT) of the signal quantity $V_2 + \Delta f_m()$ is calculated and the power U contained in a range of frequencies f outside the wanted signal bandwidth is determined:

$$U = \sum_f |DFT[V_2 + \Delta f_m()]|^2$$

The algorithm operates to provide a parameter set $P_{new}$ which minimises U.

The invention claimed is:

1. Apparatus for controlling a predistorter, said predistorter being arranged to apply a predistortion to an input signal to signal handling equipment to counter memory-effect distortion in an output signal of said equipment, wherein said predistortion is at least partially defined by a function that includes a set of one or more parameters and the apparatus comprises adjusting means for adjusting said set to determine how adjustments to said set change said distortion and control means for deploying an adjusted version of said set in said predistorter that reduces said distortion, wherein said predistortion is partly defined by a function of said input signal in which said set appears and said function shapes said predistortion by way of convolving an impulse response characteristic with another function of the input signal to produce a correction signal and subtracting from the correction signal the expectation value of said correction signal at the current value of said input signal in order to produce a difference signal that is used to produce the predistortion.

2. A method for predistorting an input signal to reduce memory-effect distortion in an output signal of signal-handling equipment, the method comprising:
  (a) convolving a function of the input signal with a filter impulse response function to generate a correction signal;
  (b) generating a difference signal between an expectation value of the input signal and the correction signal; and
  (c) predistorting the input signal based on the difference signal to generate a predistorted input signal that is applied to the signal-handling equipment.

3. The invention of claim 2, wherein the signal-handling equipment is an amplifier.

4. The invention of claim 2, wherein the function of the input signal is a mean current of the input signal.

5. The invention of claim 2, wherein the filter impulse response function is an exponential impulse response function.

6. The invention of claim 5, wherein the exponential impulse response function has form $e^{-t/\tau}$, where t is time and $\tau$ is time constant of the filter.

7. The invention of claim 2, wherein step (a) further comprises linearly scaling an output of the convolution to generate the correction signal.

8. The invention of claim 2, wherein the difference signal is generated by subtracting the expectation value of the input signal from the function of the correction signal.

9. The invention of claim 2, wherein the predistorted input signal is generated by combining a delayed version of the input signal with the difference signal.

10. The invention of claim 2, wherein the correction signal is generated by:

(i) convolving a first function of the input signal with a first finite impulse response function to generate a first convolution result;

(ii) convolving a second function of the input signal with a second finite impulse response function to generate a second convolution result; and (iii) generating the correction signal by combining a first function of the first convolution result with a second function of the second convolution result.

11. The invention of claim 2, wherein the correction signal is generated by:

(i) separately convolving the function of the input signal with two or more different finite impulse response functions to generate two or more convolution results;

(ii) linearly scaling the two or more convolution results; and (iii) combining the two or more linearly scaled convolution results to generate the correction signal.

12. The invention of claim 2, wherein the difference signal is generated by:

(i) convolving an in-phase function of the input signal with an in-phase filter impulse response function to generate an in-phase convolution result;

(ii) generating an in-phase difference signal between an expectation value of an in-phase version of the input signal and the in-phase convolution result;

(iii) multiplying the in-phase difference signal by the in-phase version of the input signal to generate a first multiplication result;

(iv) convolving a quadrature function of the input signal with a quadrature filter impulse response function to generate a quadrature convolution result;

(v) generating a quadrature difference signal between an expectation value of a quadrature version of the input signal and the quadrature convolution result;

(vi) multiplying the quadrature difference signal by the quadrature version of the input signal to generate a second multiplication result; and (vii) combining the first and second multiplication results to generate the difference signal.

13. The invention of claim 2, wherein the difference signal is generated by:

(i) convolving an amplitude function of the input signal with an amplitude filter impulse response function to generate an amplitude convolution result;

(ii) generating an amplitude difference signal between an expectation value of an amplitude version of the input signal and the amplitude convolution result;

(iii) multiplying a version of the amplitude difference signal by the amplitude version of the input signal to generate an amplitude-modulated version of the input signal;

(iv) convolving a phase function of the input signal with a phase filter impulse response function to generate a phase convolution result;

(v) generating a phase difference signal between an expectation value of a phase version of the input signal; and (vi) adjusting phase of the amplitude-modulated version of the input signal to generate a phase-adjusted, amplitude-modulated version of the input signal, wherein the difference signal is generated based on the phase-adjusted, amplitude-modulated version of the input signal.

14. The invention of claim 13, wherein the difference signal is generated by subtracting a delayed version of the input signal from the phase-adjusted, amplitude-modulated version of the input signal.

15. The invention of claim 2, wherein the predistortion for the memory-effect distortion is in series with predistortion of the input signal to reduce instantaneous distortion in the output signal.

16. The invention of claim 2, wherein the predistortion for the memory-effect distortion is based on one or more parameters generated in a time domain by minimizing a mean error vector magnitude for the output signal.

17. The invention of claim 2, wherein the predistortion for the memory-effect distortion is based on one or more parameters generated in a frequency domain by minimizing out-of-band power for the output signal.

18. An apparatus for predistorting an input signal to reduce memory-effect distortion in an output signal of signal-handling equipment, the apparatus comprising a memory-effect predistorter adapted to:

(a) convolve a function of the input signal with a filter impulse response function to generate a correction signal;

(b) generate a difference signal between an expectation value of the input signal and the correction signal; and (c) predistort the input signal based on the difference signal to generate a predistorted input signal that is applied to the signal-handling equipment.

19. The invention of claim 18, wherein the filter impulse response function is an exponential impulse response function.

20. The invention of claim 18, wherein the apparatus further comprises, in series with the memory-effect predistorter, an instantaneous predistorter adapted to predistort the input signal to reduce instantaneous distortion in the output signal.

* * * * *

UNITED STATES PATENT AND TRADEMARK OFFICE
CERTIFICATE OF CORRECTION

| | |
|---|---|
| PATENT NO. | : 7,279,972 B2 |
| APPLICATION NO. | : 10/514789 |
| DATED | : October 9, 2007 |
| INVENTOR(S) | : Antony James Smithson |

Page 1 of 1

It is certified that error appears in the above-identified patent and that said Letters Patent is hereby corrected as shown below:

In column 10, line 23, replace "detennine" with --determine--.
In column 10, line 54, replace "t" with --*t*--.

Signed and Sealed this

Twentieth Day of May, 2008

JON W. DUDAS
*Director of the United States Patent and Trademark Office*